United States Patent [19]

Bell

[11] 4,432,038
[45] Feb. 14, 1984

[54] CIRCUIT ASSEMBLIES

[75] Inventor: Melvyn R. Bell, Fife, Scotland

[73] Assignee: Ferranti, plc, Gatley, England

[21] Appl. No.: 487,055

[22] Filed: Apr. 21, 1983

Related U.S. Application Data

[60] Continuation of Ser. No. 134,462, Mar. 27, 1980, abandoned.

[30] Foreign Application Priority Data

Mar. 31, 1979 [GB] United Kingdom ............... 7911358

[51] Int. Cl.³ ............................................. H05K 7/20
[52] U.S. Cl. .................................. 361/386; 361/405;
361/426; 339/64 R; 339/112 R; 339/17 LC
[58] Field of Search ...................... 357/75, 79, 81;
174/52 FP, 16 HS; 339/17 CF, 17 LC, 64 R,
112 R, 198 H, 206 R, 207 R, 208; 361/381–383,
386–389, 393, 400, 405, 413, 426, 428

[56] References Cited

U.S. PATENT DOCUMENTS

| | | | |
|---|---|---|---|
| 2,928,059 | 3/1960 | Chamberlain | 339/64 R |
| 2,999,998 | 9/1961 | Cole | 339/64 R |
| 3,641,474 | 2/1972 | Owens | 339/112 R |
| 3,899,719 | 8/1975 | Murphy | 361/405 |

Primary Examiner—G. P. Tolin
Attorney, Agent, or Firm—Kerkam, Stowell, Kondracki & Clarke

[57] ABSTRACT

Figure 2:
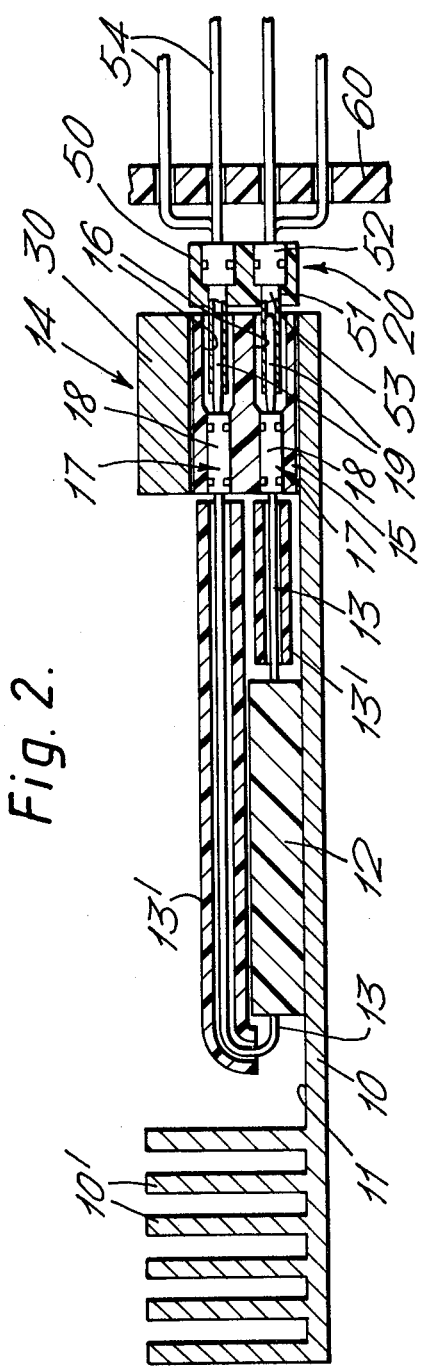

A circuit assembly comprises a planar substrate 10 supporting, on a surface 11, connectors 14 and modules 12, the connectors having a common bridging member secured to the substrate and permits movement of an electrical insulating block 15 of each connector in a plane normal to the surface 11, to ensure that the manufacturing tolerances in relation to the block are larger than otherwise would be required, and to facilitate alignment of the block in a predetermined position, when the connector is mated with an associated connector 20 (shown in FIG. 2). Possibly, aligning means for example, comprising pin and hole arrangements is provided, a part of which aligning means, for example, comprising holes 40 and 41, is provided within at least the insulating block of the connector of the circuit assembly, to co-operate with a complementary part, of pins (not shown), of the aligning means provided within the associated connector.

13 Claims, 6 Drawing Figures

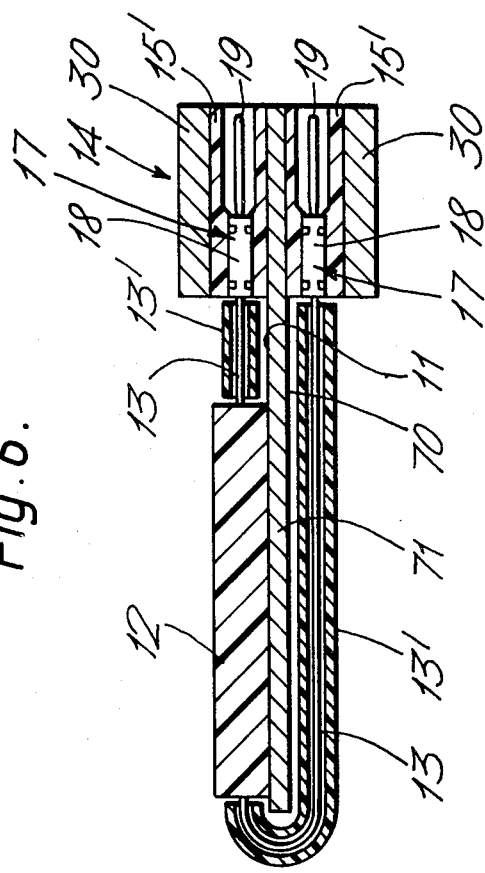
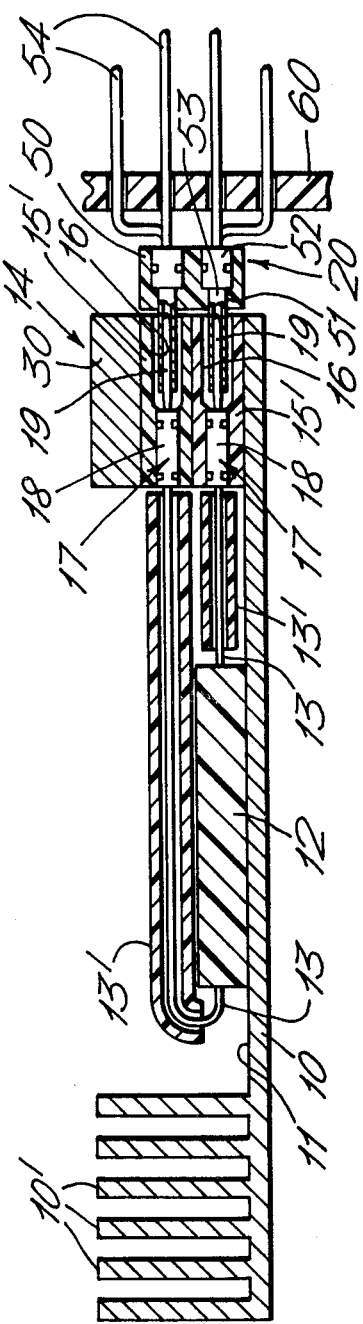
Fig. 6.
Fig. 5.

CIRCUIT ASSEMBLIES

This application is a continuation of Ser. No. 134,462, filed Mar. 27, 1980, and now abandoned.

This invention relates to circuit assemblies, and in particular to circuit assemblies each having at least one component, comprising either a discrete component or a module, with leads extending therefrom, and an at least substantially planar substrate upon which each constituent component is supported, possibly the at least substantially planar substrate comprising a heat sink.

In accordance with the main claim of our co-pending United States patent application Ser. No. 06/081,572 now continuation application Ser. No. 288,807; now abandoned a circuit assembly comprises an at least substantially planar substrate, on at least one major surface of which substrate is supported at least one component with leads extending therefrom, and there is also supported on said one major surface of the substrate at least one connector having a plurality of electrically conducting connector pieces, each connector piece both co-operating with a lead of said at least one component, and providing a terminal of the circuit assembly, the plurality of connector pieces being secured to a block of electrical insulating material of the connector.

It is, in particular, to such a circuit assembly that the present invention relates, and especially to such a circuit assembly in which the block of electrical insulating material of the connector is retained on the substrate by a bridging member of the connector, possibly the connector extending along, and adjacent to, an edge of the substrate.

It is convenient, when more than one component is provided within the circuit assembly, to provide individually a connector for each constituent component, different connectors being provided for the different components or modules. For convenience, in this specification and the accompanying claims, a connector will be considered as being associated only with one component or module of the circuit assembly, unless otherwise appropriate.

Because both said at least one component or module, and the connector, are supported on the same major surface of the at least substantially planar substrate the location within the circuit assembly of said at least one component or module, and of the terminals of the circuit assembly is facilitated. Thus, it is possible easily to provide the required electrical interconnections between the leads of said at least one module or component, and the terminals of the circuit assembly, without the necessity of including a printed circuit board within the circuit assembly.

In a circuit assembly according to the present invention at least substantially the whole of each lead of said at least one module or component may extend at least substantially parallel to said one major surface of the substrate, and may extend at least substantially wholly in a common plane, if the leads extend from only one surface of the module or component; or each lead may extend at least substantially in one of two such parallel planes in which the leads extend, if the leads extend from two opposing surfaces of the module or component. Each connector piece usually extends parallel to at least substantially the whole of the lead to which the connector piece is connected. Thus, the connector pieces extend parallel to each other, parallel to said one major surface of the substrate, and extend at right angles to at least one surface of the insulating block, an associated connector, to co-operate, and mate, with the connector of the circuit assembly, to abut against said one surface of the insulating block, possibly, so that the circuit assembly can comprise part of a more complex circuit assembly. In addition, it is in particular to such a circuit assembly that the present invention relates.

Because the terminals of a circuit assembly according to the present invention are required to be connected to an associated connector, the manufacturing tolerances in relation to the block of insulating material of the connector of the circuit assembly are required to be smaller than otherwise would be the case; and it is required to align accurately the block of electrical insulating material at a predetermined position within the circuit assembly, when the connector is mated with the associated connector.

It is an object of the present invention to provide such a circuit assembly of a form as described and claimed in our above-mentioned co-pending United States patent application Ser. No. 288,807, and of the form referred to in particular above, but having a construction facilitating the provision of a suitable block of electrical insulating material of the connector within the circuit assembly, the required manufacturing tolerances in relation to the block being readily obtained, and the block being capable of being aligned accurately at a predetermined position within the circuit assembly when the connector is mated with an associated connector.

According to the present invention a circuit assembly comprises an at least substantially planar substrate, on at least one major surface of which substrate is supported at least one component or module with leads extending therefrom, and there is also supported on said one major surface of the substrate at least one connector connected to said at least one component or module, the connector having a plurality of electrically conducting connector pieces, each connector piece both co-operating with a lead of the component or module, and providing a terminal of the circuit assembly, the leads extend at least substantially in at least one plane parallel to said one major surface of the substrate, and the connector pieces extend parallel to each other, and parallel to said one major surface of the substrate, the connector pieces are secured to a block of electrical insulating material of the connector, and extend at right angles to at least one surface of the insulating block, an associated connector, to co-operate, and mate, with the connector of the circuit assembly, to abut against said one surface of the insulating block, and the block of electrical insulating material is retained by at least one bridging member of the connector, and the arrangement is such that, with the bridging member secured to the substrate, the block co-operates with the bridging member to be retained between the bridging member and the substrate in a manner which permits movement of the block relative to the substrate, and relative to the bridging member, in a plane normal to said one major surface of the substrate.

Hence, the insulating block is in a retained but floating, relationship with the bridging member, and the substrate.

Because the leads of said at least one component or module extend at least substantially in at least one plane parallel to said one major surface of the substrate, and because the connector pieces extend parallel to each other, parallel to said one major surface of the substrate, and extend at right angles to at least one surface of the insulating block, it is possible for there to be permitted movement of the block relative to the substrate, and relative to the bridging member, in a plane normal to said one major surface of the substrate.

The permitted movement of the block relative to the substrate, and relative to the bridging member, may be along either one or both of two orthogonal axes within the plane normal to said one major surface of the substrate. The extent of the permitted movement of the block along the, or either, orthogonal axis may be substantially equal to the width of a connector piece along the axis.

The permitted movement of the block ensures that the manufacturing tolerances in relation to the block are larger than otherwise would be required. Further, the permitted movement of the block facilitates the alignment of the block in the predetermined position within the circuit assembly when the connector is mated with an associated connector, the mating with the associated connector causing the block to move into the predetermined position, and to be appropriately aligned in this predetermined position. It is required that the block is held firmly within the circuit assembly when the connector is mated with the associated connector.

Part of aligning means may be provided within the connector of the circuit assembly, to co-operate with a complementary part of the aligning means provided within an associated connected to co-operate with the connector, the aligning means facilitating the mating in the required manner of the connector of the circuit assembly with the associated connector. The aligning means may comprise at least one pin and hole arrangement, with one part of such aligning means being in the connector of the circuit assembly, and the other part of the aligning means being in the associated connector. The part of the aligning means provided in the circuit assembly may comprise at least one hole within the block of insulating material, and possible also within the bridging member. Said at least one hole may extend, at least substantially coaxially, within both the bridging member and the block of insulating material.

The bridging member may be secured to the substrate in any convenient way.

The leads of said at least one module or component may be secured to the connector pieces in any convenient manner.

Whilst each connector piece may have any convenient form, it may comprise a socket part integral with a spigot part, the socket part being connected to a lead of said at least one module or component, and the spigot part comprising a terminal of the circuit assembly.

The connector pieces may be secured to the leads of the component or module either before or after the connector pieces are secured to the block of electrical insulating material of the connector. With either such arrangement, the combination of the insulating block, and the component, secured thereto, may comprise a sub-assembly unit to be secured to the substrate to complete the circuit assembly.

Said at least one component of the circuit assembly may be secured within the circuit assembly in any convenient manner. Desirably, the component is secured within the circuit assembly in a readily detachable manner, to facilitate the replacement of the component, for example, when faulty. The securing of the insulating block to the substrate is in a readily detachable manner if the bridging member is secured to the substrate in a readily detachable manner, as conveniently may be provided. Possibly the insulating block is replaced with the component. In addition, or alternatively, the component is secured to the insulating block in a readily detachable manner. Possibly, the connector pieces are secured to the insulating block in a readily detachable manner, to be replaced with the component, the connector pieces possibly being detachably secured within bores in the insulating block by each being a press fit therein. Alternatively, the component is secured to the connector pieces in a readily detachable manner. Said at least one component may be detachably secured to the substrate by being clamped thereto in a readily releasable manner.

The circuit assemblies described and claimed in our co-pending United States patent application Ser. No. 134,463 each are substantially the same as circuit assemblies in accordance with the present invention, except that, inter alia, said at least one constituent module or component is required to have leads extending from two opposing surfaces thereof, the leads from one surface of the component or module exclusively extend at least substantially in one of two planes parallel to said one major surface of the substrate, in which planes the leads extend, and leads extending from different surfaces of the component or module extend in different planes parallel to said one major surface of the substrate, and the block of insulating material is in two separable parts, the two separable block parts being stacked one on the other, and are rigidly secured to the substrate in any convenient way within the completed circuit assembly, and the leads extending from one surface of the component or module are connected exclusively to the connector pieces secured to one of the two separable block parts, the leads extending from different surfaces of the component or module being connected to the connector pieces secured to different separable block parts, and the connections between the connector pieces and the leads are at least partially protected by the connections being on, or within, or adjacent to, the insulating block.

By providing an insulating block comprising two separable parts, conveniently, the leads extending from one surface of the component or module can be secured to their associated connector pieces and to their associated separable part of the insulating block, and the leads extending from the other surface of the component or module conveniently can be secured to their associated connector pieces and to their associated separable part of the insulating block, before the component or module, and the insulating block, are supported on the substrate of the circuit assembly. Subsequently, and conveniently, the leads are bent into their relative positions required in the completed circuit assembly, with the two separable parts of the insulating block being stacked one on the other. In this form, the component or module, and the insulating block, together comprise a sub-assembly unit of the circuit assembly. The sub-assembly unit then is secured to the substrate to complete the circuit assembly. Hence, the connections between the connector pieces and the leads are at least partially protected whilst the component or module, and the insulating block, are being secured to the substrate. The connector pieces may be secured to the separable parts of the insulating block either before, or after, the leads of the component or module are secured to the connector pieces.

When the leads extend from two opposing surfaces of said at least one module or component, and each lead extends at least substantially in one of the two planes parallel to said one major surface of the substrate, and in which planes the leads extend, in a circuit assembly in accordance with the present invention, it may be convenient to provide for the connector a block of insulating material in two separable parts, the two separable block parts being stacked one on the other between said at least one bridging member and the substrate, the two block parts being retained between said at least one bridging member and the substrate within the completed circuit assembly. The arrangement of the circuit assembly is such that there is permitted movement between the two separable parts of the block along either one or both of two orthogonal axes in a plane normal to said one major surface of the substrate, with said at least one bridging member secured to the substrate.

In one such arrangement, the leads of said at least one component or module extend along each of both opposing major surfaces of the substrate, and the two separable parts of the block of insulating material are supported one on each of the two opposing major surfaces of the substrate, the two separable parts of the block being stacked one on the other, and being retained, by a bridging member, or two bridging members, within the completed circuit assembly, with the substrate intermediate therebetween. Hence, a single connector is considered to be on both major surfaces of the substrate.

The two separable block parts may be so shaped as to be interchangeable with each other. Either a common associated connector, or two associated connectors, may co-operate, and mate, with the two separable block parts of such a connector of the circuit assembly. If two associated connectors are provided each is to co-operate individually with a separable block part.

More than one component or module may be connected to a connector, and/or more than one connector may be connected to a component or module, but as stated above, it is convenient, when more than one component and/or module is provided within the circuit assembly, to provide individually a connector for each constituent component or module.

A plurality of electrical insulating blocks, for a plurality of connectors, may be provided within the circuit assembly. The plurality of electrical insulating blocks may be so shaped as to be interchangeable with each other. Either a common associated connector or a plurality of associated connectors, may co-operate, and mate, with the plurality of connectors of the circuit assembly.

A plurality of insulating blocks, or the parts of a plurality of insulating blocks, may be provided on either major surface of the substrate, and a common bridging member may be provided for these blocks or block parts, usually each connector so provided extending linearly along a linear edge of the substrate. Conveniently, the common bridging member has a plurality of constituent parts, each such part individually spanning an insulating block or insulating block part, and the provided plurality of insulating blocks or insulating block parts may be so shaped as to co-operate with each other, in the required manner, in addition to co-operating with the common bridging member.

When a plurality of electrical insulating blocks, for a plurality of connectors, are provided, each such insulating block not comprising two separable parts, an electrical insulating block may be provided on each of both opposing major surfaces of the substrate, each insulating block co-operating with a bridging member to be retained between the bridging member and the substrate in a manner which permits movement of the block or block part relative to the substrate and relative to the bridging member, in a plane normal to said one major surface of the substrate. Thus, the leads of said at least one component or module of the circuit assembly extend from two opposing surfaces of the component or module, and extend along each of both opposing major surfaces of the substrate; and/or at least one constituent module or component of the circuit assembly is provided on each of both opposing major surfaces of the substrate.

In any form of circuit assembly referred to above, at least one constituent module or component may be provided on each of both opposing major surfaces of the substrate.

The at least substantially planar substrate of the circuit assembly may comprise a heat sink; or may be of electrical insulating material.

According to another aspect the present invention comprises the combination of a circuit assembly of any one of the forms referred to above, and at least one associated connector to co-operate, and mate, with the connector or connectors of the circuit assembly.

The, or each, associated connector may have a known form.

According to yet another aspect the present invention comprises the combination of at least one first circuit assembly, each first circuit assembly being of any one of the forms referred to above as a circuit assembly according to the present invention, and at least one second circuit assembly, the combination comprising a more complex circuit assembly than any constituent circuit assembly, each second circuit assembly having at least one connector, comprising the associated connector referred to above, and to co-operate, and mate, with the connector or connectors of the first circuit assembly.

The required electrical interconnections between a plurality of constituent modules and/or components of a first circuit assembly may be provided by a second circuit assembly.

Said at least one second circuit assembly may at least include a pattern of conductors on an electrical insulating support, such as a printed circuit board.

At least one module or component of the more complex circuit assembly may be provided in said at least one second circuit assembly.

The, or each, connector of said at least one second circuit assembly may have a known form.

Figure 1:
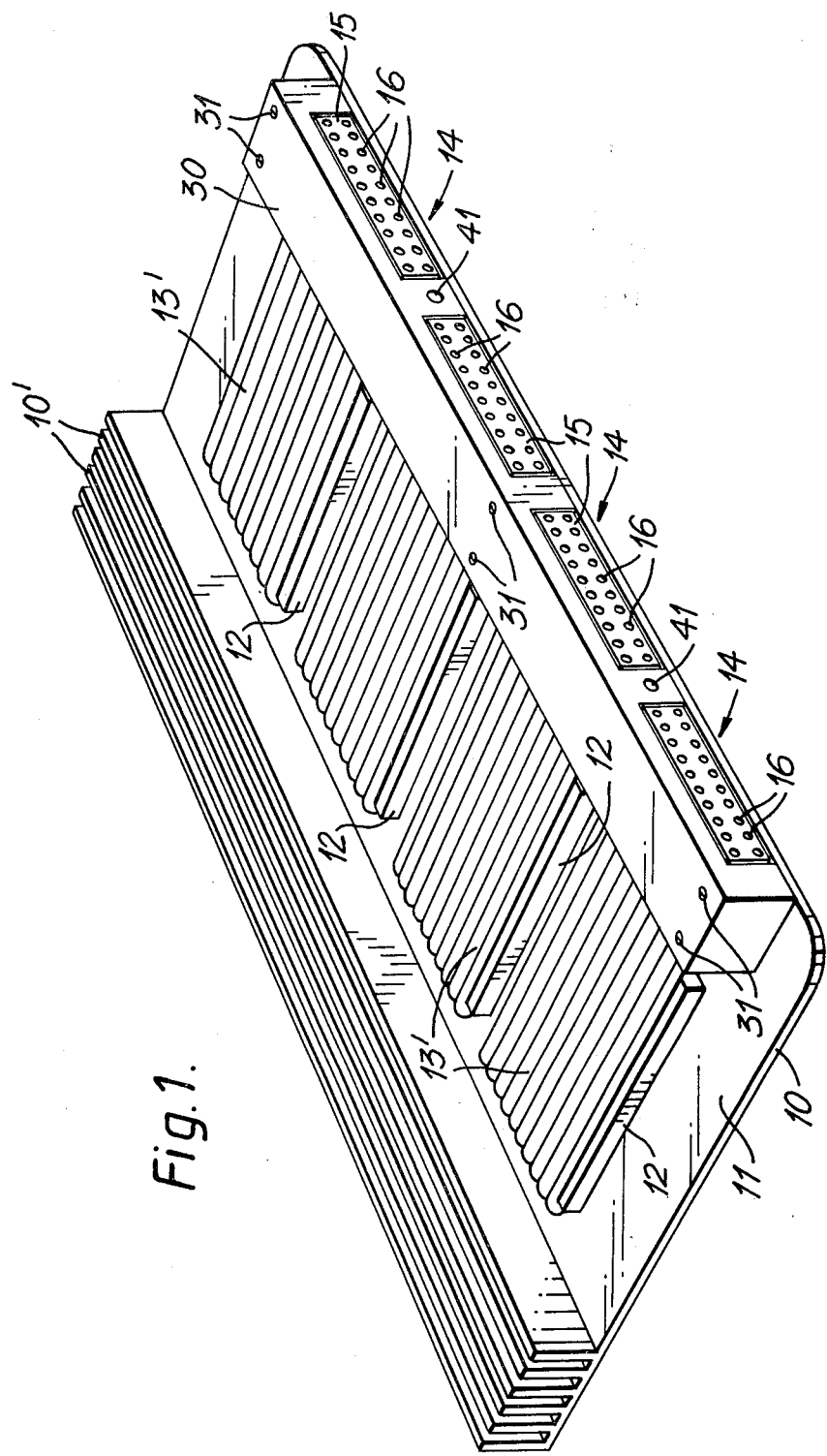
Figure 3:
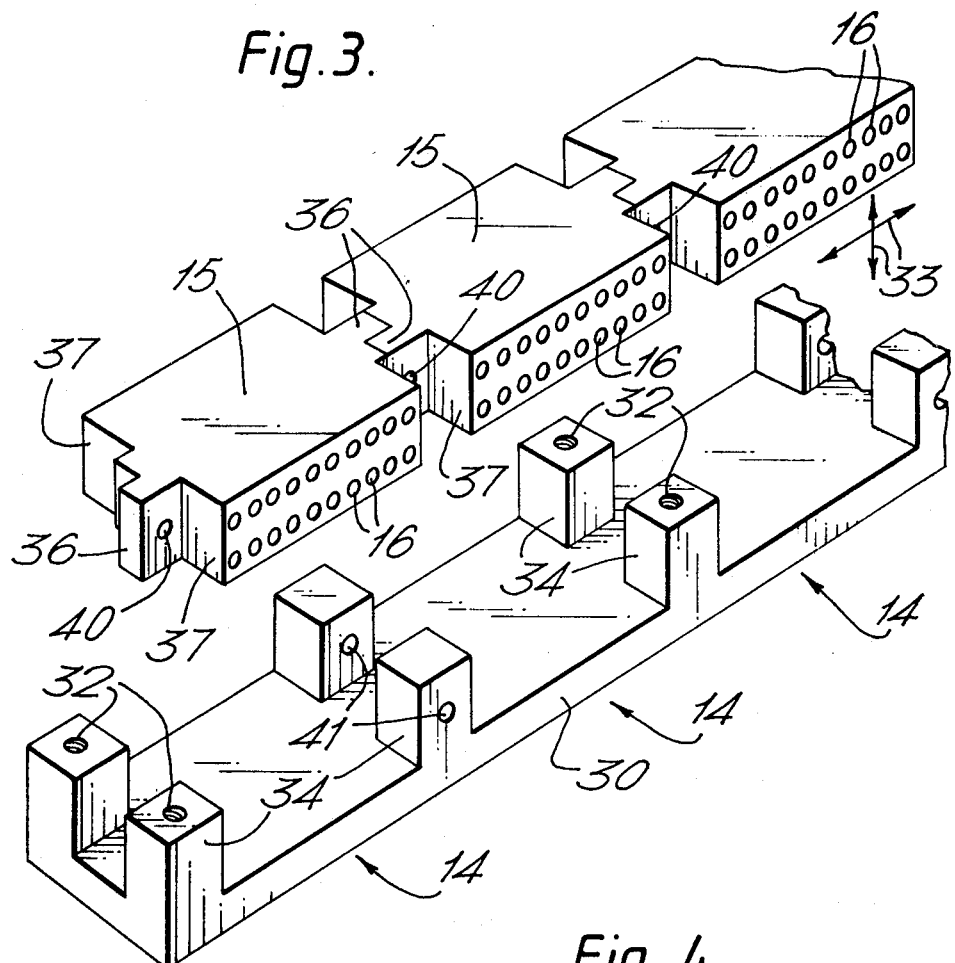
Figure 4:
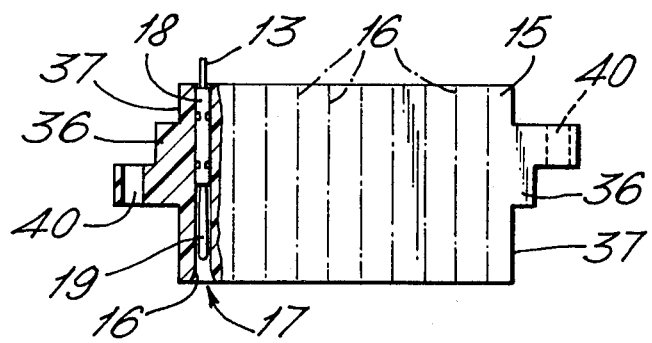

The present invention will now be described by way of example with reference to the accompanying drawings, in which, FIG. 1 is a perspective view of a circuit assembly comprising one embodiment in accordance with the present invention, the circuit assembly having four modules, and four connectors for the modules, supported on a major surface of an at least substantially planar substrate, FIG. 2 is a section of the circuit assembly of FIG. 1, comprising a first circuit assembly, together with both an associated connector co-operating with the connectors of the first circuit assembly, and part of a second circuit assembly, FIG. 3 is an exploded view of part of the arrangement of the four connectors of the first circuit assembly of FIGS. 1 and 2, the connectors being inverted in FIG. 3, in relation to their orientation in FIGS. 1 and 2, FIG. 4 is a partially sectioned, plan view of a block of electrical insulating material of a connector of the first circuit assembly of FIGS. 1 to 3, the sectioned part of FIG. 4 showing an electrical conducting connector piece of the connector, FIG. 5 corresponds to FIG. 2, but is of a circuit assembly with each provided block of electrical insulating material having two separate parts, and FIG. 6 also corresponds to FIG. 2, but is a circuit assembly having a single connector considered to be on both major surfaces of the substrate.

The illustrated circuit assembly shown in FIGS. 1 to 4 has a substantially planar substrate comprising a heat sink 10 of aluminium, the substrate being rectangular shaped in plan. Supported on one major surface 11 of the heat sink 10 are four, square shaped in plan, modules 12, each module 12 having a plurality of leads 13 (shown only in FIGS. 2 and 4), extending from each of two opposing surfaces of each module.

As shown in FIGS. 1 and 2, the leads 13, individually, are covered by sleeves 13' of electrical insulating material. Four connectors 14, also comprising parts of the circuit assembly, are provided, the connectors extending along, and adjacent to, one edge of the major surface 11 of the heat sink 10. The leads 13 extend at least substantially in two parallel planes, these planes being parallel to the module-bearing surface 11 of the substrate 10.

In order to facilitate the extraction of heat from the heat sink 10, the heat sink is provided with fins 10' and so the heat sink is only substantially planar in form.

Each connector 14 includes a block 15 of electrical insulating material, in bores 16 in each of which blocks 15 are provided a plurality of electrically conducting connector pieces 17 (shown only in FIGS. 2 and 4), with a connector piece 17 individually in each bore 16. Each connector piece 17 has a socket part 18 to receive a module lead 13, and an integral spigot part 19, comprising a terminal of the circuit assembly, the terminal to co-operate with a socket of a connector 20, shown only in FIG. 2, to be associated with the circuit assembly. The associated connector 20 has a known construction.

Because both the modules 12 and the connectors 14 are supported on the major surface 11 of the heat sink 10, the location within the circuit assembly of the modules 12, and of the spigots 19 is facilitated. Thus, it is possible easily to provide a desired circuit assembly, and in particular to provide the required electrical interconnections between the modules 12 and the spigots 19, without the necessity of including a printed circuit board within the circuit assembly.

Each connector piece extends parallel to at least substantially the whole of the lead to which the connector piece is connected. Thus, the connector pieces extend parallel to each other, parallel to the major surface 11 of the substrate. The connector pieces also extend at right angles to a surface of the insulating block, against which surface is to abut the associated connector 20.

In fabricating the circuit assembly, initially the socket parts 18 of the connector pieces 17 of the connector 14 are secured to the leads 13 of the modules 12. Then the connector pieces 17 are secured within each block 15 of insulating material. Alternatively, in an unillustrated arrangement, the connector pieces 17 are secured to the block of insulating material before the connector pieces are secured to the module leads. With either such arrangement, the combination of the insulating block, and the module secured thereto, comprises a sub-assembly unit to be secured to the substrate 10 when completing the circuit assembly.

The socket part 18 of each connector piece 17 is arranged to be capable of being tightened around the co-operating module lead 13 before the connector piece 17 is inserted into its bore 16 in the block 15. Each socket part may not comprise a complete cylinder, but may comprise any convenient construction having at least one portion to be tightened around the co-operating module lead 13. The construction of the connector piece 17 as a whole is such that the connector piece is a press fit within the bore 16 of the block 15, after the connector piece has been secured to a module lead 13. Each connector piece 17 does not extend beyond the bore 16, and so is embedded within the block 15.

Because the terminals of the circuit assembly are required to be connected to an associated connector the manufacturing tolerances in relation to the block of insulating material of the connector 14 are required to be smaller than otherwise would be the case; and it is required to align accurately the block of electrical insulating material at a predetermined position within the circuit assembly, when the connectors 14 are mated with the associated connector 20.

In order to provide a circuit assembly in which the blocks 15 of electrical insulating material of the connectors 14 have readily obtainable required manufacturing tolerances, and the blocks are capable of being aligned accurately at a predetermined position within the circuit assembly when each connector 14 is mated with the associated connector 20, and in accordance with the present invention, each block of electrical insulating material is retained by a bridging member 30 of the connector. The bridging member 30 is secured to the substrate by screws 31, the screws extending through bores 32 (shown in FIG. 3). The common bridging member spans each insulating block 15, and has four constituent parts, each such part individually spanning an insulating block. The arrangement is such that, with the bridging member 30 secured to the substrate, each insulating block co-operates with the bridging member to be retained between the bridging member and the substrate in a manner which permits movement of the block relative to the substrate, and relative to the bridging member, in a plane normal to the major surface 11 of the substrate. Hence, the block is in a retained, but floating, relationship with the bridging member and the substrate. The permitted movement of the block is along both of two orthogonal axes within the plane normal to the major surface 11 of the substrate, and the extent of the permitted movement of the block along either orthogonal axis is substantially equal to the width of a connector piece 17 along the axis. The two orthogonal axes of the permitted movement of each block is indicated by arrows 33 shown in FIG. 3.

The permitted movement of the blocks ensures that the manufacturing tolerances in relation to the blocks are larger than otherwise would be required, and are readily obtainable. Further, the permitted movement of the blocks facilitates the alignment of the blocks in the predetermined position within the circuit assembly when the connectors 14 are mated with the associated connector 20, the mating with the associated connector causing the blocks to move into the predetermined position, and to be appropriately aligned in this predetermined position. It is required that each block is held firmly within the circuit assembly when the connectors 14 are mated with the associated connector.

Each constituent part of the common bridging member 30 has four, square-shaped in section, legs 34, with a leg 34 at each corner of the portion of the bridging member part to span an insulating block of the connector, each leg extending normally to the spanning portion. Each adjacent constituent pair of parts of the common bridging member shares a common pair of legs, there being five pairs of legs provided for the four illustrated connectors. Each insulating block is a close fit between opposing surfaces of the two pairs of square shaped legs 34 of the connector including the insulating block.

Because the leads of the modules extend at least substantially in at least one plane parallel to the module-bearing major surface of the substrate, and because the connector pieces extend parallel to each other, parallel to the module-bearing major surface of the substrate, and extend at right angles to at least one surface of the insulating block, it is possible for there to be permitted movement of the block relative to the substrate, and relative to the bridging member, in a plane normal to the module-bearing major surface of the substrate.

Adjacent pairs of the electrical insulating blocks 15 co-operate with each other, in addition to co-operating with the common bridging member in the required manner as referred to above, and the shape of each of the insulating blocks is shown in detail in FIGS. 3 and 4. Thus, each block is provided with lugs 36, one lug 36 being provided on either side surface 37 of the block extending parallel to the bores 16 for the connector pieces, and when the block is viewed in plan in the circuit assembly. The lugs 36, when so viewed in plan, are 'L'-shaped in section, and for each block, one arm of each lug is contiguous with the central part of the co-operating side surface of the block, and the lugs on the two side surfaces of the block are inverted. The arrangement is such that the lugs on two adjacent blocks within the circuit assembly are complementary with each other, and engage with each other, thereby the two adjacent blocks co-operating with each other.

The shape of the electrical insulating blocks is such that the blocks are interchangeable with each other within the circuit assembly.

The combination of the co-operating lugs of each adjacent pair of insulating blocks of the four connectors co-operate with the common bridging member by being a close fit between opposing surfaces of the pair of square shaped legs of the bridging member common to the two connectors having the insulating blocks with the two co-operating lugs, in addition to each insulating block being a close fit between opposing surfaces of the two pairs of legs of the connector including the insulating block, and as referred to above. However, space is left between the insulating blocks and the common spanning portion of the bridging member to provide the permitted movement of the insulating blocks.

The two outer pairs of legs of the common bridging member individually are a close fit for the outer lugs of the four co-operating insulating blocks, which outer lugs do not co-operate with any other lugs.

The bores 32, for the screws 31 securing the common bridging member to the substrate, extend through three spaced pairs of legs of the bridging member.

Aligning means for the insulating blocks of the four connectors 14 of the circuit assembly and the common associated connector 20 also is provided, the aligning means comprising pin and hole arrangements. Part of the aligning means, comprising the holes, are provided in the connectors 14, and are to co-operate with a complementary part of the aligning means, comprising the pins (not shown), provided on the associated connector 20. The holes in the connectors each includes a bore 40 provided through the part of each lug 36 furthest from the main body of the insulating block 15 bearing the lugs, the bore 40 extending parallel to the bores 16 for the connector pieces provided within the main body of the block. Within the circuit assembly, adjacent bores 40 in the combination of the co-operating lugs 36 of each pair of adjacent blocks are at least in substantial alignment with each other. Each hole also includes bores 41 through a pair of legs 34 of the bridging member, the bores 41 also being in alignment with each other. Within the circuit assembly, for each hole the four constituent bores 40 and 41 are at least substantially co-axial with each other. One such hole is provided in relation to each of two of the intermediate pairs of legs 34, except the centrally located pair of legs, of the five pairs of legs of the bridging member. The arrangement of the aligning means is such that the pins provided on the associated connector 20 easily traverse the holes 40 and 41 in the connectors 14 of the circuit assembly. In particular, however, the aligning means is arranged such that the insulating blocks 15 of the four connectors 14 are at a predetermined position within the circuit assembly, when the connectors are mated with the associated connector 20.

Each hole of the pin and hole arrangements may be provided only within an insulating block.

As shown in FIG. 2, the associated connector 20 comprises a block 50 of electrical insulating material, in bores 51 in which block 50 are provided a plurality of electrically conducting connector pieces 52, with a connector piece 52 individually in each bore 51. Each connector piece has a socket part 53, shown partially cutaway in FIG. 2, and to co-operate with the spigot part 19 of a connector 14 of the circuit assembly. For this purpose a portion of the socket part 53 extends beyond the associated bore 51. Within the bore 51 the socket part 53 is secured to a conductor 54 co-operating with a second circuit assembly shown generally at 60. For convenience, in the illustrated arrangement, adjacent pairs of conductors 54 of the associated connector 20, whilst extending substantially wholly parallel to each other, are in four spaced, parallel, planes, to facilitate making electrical contact therewith. The associated connector 20 is to abut against one surface of each insulating block 15 of the circuit assembly, each connector piece 17 secured to the insulating block extending at right angles to this surface of the insulating block.

Instead of providing a common associated connector, a plurality of associated connectors may co-operate, and mate, with the plurality of connectors 14.

The modules 12 may be replaceable, for example, when faulty. It is required that the modules 12 are detachable secured to the substrate 10, for example, by being clamped thereto in a readily releasable manner, as described and claimed in our co-pending United States patent application Ser. No. 134,464 or the modules are not directly secured to the substrate. The securing of each insulating block to the substrate is in a readily detachable manner because the bridging member 30 is secured to the substrate in a readily detachable manner.

Possibly an insulating block 15 is replaced with a module 12. In addition, or alternatively, each module 12 is secured to an insulating block in a readily detachable manner, possibly the connector pieces 17 being secured to the insulating block in a readily detachable manner, to be replaced with the module, for example, the connector pieces being a press fit within bores 16 in the insulating block as described above. Alternatively, the leads 13 of each module are secured to the connector pieces in a readily detachable manner.

The leads of each module may only extend from one surface of the module, and extend at least substantially in only one, common, plane parallel to the module-bearing surface of the substrate.

There may be provided only one module and one connector within the circuit assembly.

The aligning means may have any convenient form; or may not be required, and may be omitted.

In the circuit assemblies described above the permitted movement of each block relative to the substrate, and relative to the bridging member is along either of two orthogonal axes within the plane normal to the module-bearing surface of the substrate. However, the arrangement may be such that the permitted movement of each block is required to be along only one of such two orthogonal axes.

The extent of the permitted movement of each insulating block along the, or either orthogonal axis, within the plane normal to the module-bearing surface of the substrate, may be other than substantially equal to the width of a connector piece along the axis.

There is described and claimed in our co-pending U.S. Ser. No. 134,463 patent application serial number circuit assemblies each of which are substantially the same as circuit assemblies in accordance with the present invention, except that, inter-alia, each constituent module is required to have leads extending from two opposing surfaces thereof, the leads from one surface of the module exclusively extend at least substantially in one of two planes parallel to the module-bearing surface of the substrate, in which planes the leads extend, and leads extending from different surfaces of the module extend in different planes parallel to the module-bearing surface of the substrate, and the block of insulating material is in two separable parts, the two separable block parts being stacked one on the other, and are rigidly secured to the substrate in any convenient way within the completed circuit assembly, and the leads extending from one surface of the module are connected exclusively to the connector pieces secured to one of the two separable block parts, the leads extending from different surfaces of the module being connected to the connector pieces secured to different separable block parts, and the connections between the connector pieces and the leads are at least partially protected by the connections being on, or within, or adjacent to, the insulating block.

By providing an insulating block comprising two separable parts, conveniently, the leads extending from one surface of the module can be secured to their associated connector pieces and to their associated separable part of the insulating block, and the leads extending from the other surface of the module conveniently can be secured to their associated connector pieces and to their associated separable part of the insulating block, before the module and the insulating block are supported on the substrate of the circuit assembly. Subsequently, and conveniently, the leads are bent into their relative positions required in the completed circuit assembly, with the two separable parts of the insulating block being stacked one on the other. In this form, the module and the insulating block together comprise a sub-assembly unit of the circuit assembly. The sub-assembly unit then is secured to the substrate to complete the circuit assembly. Hence, the connections between the connector pieces and the leads are at least partially protected whilst the module and the insulating block are being secured to the substrate. The connector pieces may be secured to the separable parts of the insulating block either before, or after, the leads of the module are secured to the connector pieces.

In such a circuit assembly in accordance with the present invention, as shown in FIG. 5, and in respect of which the same reference numerals are used as in FIGS. 1 to 4 to identify the same or closely resembling parts, an insulating block having two separable block parts 15' is provided. The arrangement is such that there is permitted movement between two separable parts 15' of the block along either one or both of two orthogonal axes in a plane normal to the major surface 11 of the substrate 10, with the bridging member 30 secured to the substrate 10, the insulating block being in a retained, but floating, relationship with the bridging member, and the substrate, in the manner described above in relation to the circuit assembly of FIGS. 1 to 4.

In another such arrangement, in accordance with the present invention, as shown in FIG. 6, and in respect of which the same reference numerals are used as in FIG. 5 to identify the same or closely resembling parts, the leads 13 of the module 12 extend along each of both opposing major surfaces 11 and 70 of the substrate 71, and the two separable parts 15' of the block of insulating material are supported one on each of the two opposing major surfaces 11 and 70 of the substrate 71, each by a bridging member 30, the two separable parts of the block being considered as being stacked one on the other, and retained together, by the two bridging members 30, with the substrate 71 intermediate therebetween. Hence, a single connector is considered to be on both major surfaces 11 and 70 of the substrate.

The two separable block parts may be so shaped as to be interchangeable with each other. Either a common associated connector, or two associated connectors may co-operate, and mate, with the two separable block parts. If two associated connectors are provided each is to co-operate individually with a separable block part.

If a plurality of insulating blocks each with two separable block parts, are provided within the circuit assembly, the parts of the plurality of insulating blocks may be provided on either major surface of the substrate. A common bridging member, or bridging members may be provided within such a circuit assembly. The parts of the plurality of insulating blocks may be so shaped as to co-operate with each other, in the required manner, in addition to co-operating with the bridging member or members.

At least one module of the illustrated circuit assembly may be omitted, and at least one discretely packaged component, possibly only having two leads extending therefrom, provided instead, there being at least one module or component provided in the circuit.

It is not essential that all the connector pieces 17 of the provided connector 14 co-operate with modules or components. Thus, for example, one of the illustrated modules 12 may be omitted from the circuit assembly, or different modules have different numbers of leads.

More than one component or module may be connected to a connector, and/or more than one connector may be connected to a component or module.

Each bridging member may have any convenient form, and may be secured to the substrate in any convenient way.

Each provided insulating block may be arranged to co-operate with the associated bridging member in any convenient manner, so that the insulating block is in a retained, but floating, relationship with the bridging member, and the substrate.

The modules may have any convenient construction, and for example, comprise thin film modules of known forms.

Components, when provided, may comprise any known forms of components, such as resistors and capacitors.

The connector pieces 17 may be secured to the block 15 in any convenient way instead of being a press fit in bores therein.

At least one insulating block, each not comprising two separable block parts, may be provided on each of both opposing major surfaces of the substrate, the block co-operating with a bridging member to be retained between the bridging member and the substrate in a manner which permits movement of the block relative to the substrate, and relative to the bridging member, in a plane normal to said one major surface of the substrate. Thus, the leads of said at least one component or module of the circuit assembly extend from two opposing surfaces of the component or module, and extend along each of both opposing major surfaces of the substrate; and/or at least one constituent module or component of the circuit assembly is provided on each of both opposing major surfaces of the substrate.

In any form of circuit assembly referred to above, at least one constituent module or component may be provided on each of both opposing major surfaces of the substrate.

When a plurality of electrical insulating blocks are provided within a circuit assembly it is not essential that the insulating blocks co-operate with each other; nor that they are so shaped as to be interchangeable with each other.

The leads may be secured to the connector pieces in any convenient manner.

The connector pieces may have any convenient form. The connector pieces may not be substantially embedded in an insulating block, but instead the connector pieces may be at least partially exposed after being secured to the insulating block.

The at least substantially planar substrate may not comprise a heat sink, for example, being of electrical insulating material.

At least one first circuit assembly, comprising a circuit assembly referred to as a circuit assembly according to the present invention, and of any one of the forms described above, may be connected to at least one second circuit assembly 60, as shown in FIG. 2, to form a more complex circuit assembly than any constituent circuit assembly, the more complex circuit assembly being in accordance with another aspect of the present invention, each second circuit assembly having at least one connector, comprising the associated connector referred to above, to co-operate, and mate, with the connector or connectors of the first circuit assembly.

The required electrical interconnections between a plurality of constituent modules and/or components of a first circuit assembly may be provided by a second circuit assembly.

Said at least one second circuit assembly may at least include a pattern of conductors on an electrical insulating support, such as a printed circuit board.

At least one module or component of the more complex circuit assembly may be provided in said at least one second circuit assembly.

Any such arrangement is advantageous in that designing the construction of the more complex circuit assembly is facilitated; it is easy to remove a first circuit assembly with a faulty component or module; and it is possible to have a standard construction for each first circuit assembly, and perhaps also it is possible to have a standard construction for each second circuit assembly, for each of a plurality of different possible more complex circuit assemblies, each different possible first circuit assembly, and perhaps also each different possible second circuit assembly, respectively, varying from each other only in the form of, and/or in the number of, constituent modules and/or components, where appropriate.

What I claim is:

1. A combination of a circuit assembly, comprising an at least substantially planar substrate, on at least one major surface on which substrate is supported at least one component with leads extending therefrom, and there is also supported on said one major surface of the substrate at least one connector connected to said at least one component, the connector having a plurality of electrically conducting connector pieces, each connector piece both co-operating with a lead of the component, and providing a terminal of the circuit assembly, the leads extend at least substantially in at least one plane parallel to said one major surface of the substrate, and the connector pieces extend parallel to each other, and parallel to said one major surface of the substrate, the connector pieces are secured to a block of electrical insulating material of the connector, and extend at right angles to at least one surface of the insulating block, and the block of electrical insulating material is retained by at least one bridging member of the connector with the bridging member secured to the substrate, the block co-operates with the bridging member and is loosely retained between the bridging member and the substrate whereby movement of the block is provided relative to the substrate and relative to the bridging member, in a plane normal to said one major surface of the substrate, and the combination also including at least one other connector cooperating, and mating with said at least one connector of the first circuit assembly and abutting against said one surface of the insulating block.

2. A combination of a circuit assembly as claimed in claim 1 in which the permitted movement of the block relative to the substrate, and relative to the bridging member, can be along both of two orthogonal axes within the plane normal to said one major surface of the substrate.

3. A combination of a circuit assembly as claimed in claim 1 in which the extent of the permitted movement of the block within the plane normal to said one major surface of the substrate is substantially equal to the width of a connecting piece.

4. A circuit assembly as claimed in claim 1 in which part of aligning means is provided within the connector of the circuit assembly, cooperating with a complementary part of the aligning means provided within said at least one other connector, the aligning means facilitating the mating in the required manner of the connector of the circuit assembly with the associated connector.

5. A combination of a circuit assembly as claimed in claim 4 in which the aligning means comprises at least one pin and hole arrangement, with one part of such aligning means being in the connector of the circuit assembly, and the other part of the aligning means being in said at least one other connector.

6. A combination of a circuit assembly as claimed in claim 1 in which the leads extend from two opposing surfaces of said at least one component, each lead extends at least substantially in one or two planes parallel to said one major surface of the substrate, and in which planes the leads extend, and a block of insulating material in two separable parts is provided for the connector of the circuit assembly, the two separable block parts being stacked one on the other between the bridging member and the substrate, the two block parts being retained between said at least one bridging member and the substrate within the completed circuit assembly.

7. A combination of a circuit assembly as claimed in claim 6 in which the leads of said at least one component extend along each of both opposing major surfaces of the substrate, and the two separable parts of the block of insulating material are supported one on each of the two opposing major surfaces of the substrate, the two separable parts of the block being stacked one on the other, and are retained, by at least one bridging member, within the completed circuit assembly, with the substrate intermediate therebetween.

8. A combination of a circuit assembly as claimed in claim 6 in which the two separable block parts are so shaped as to be interchangeable with each other.

9. A combination of a circuit assembly as claimed in claim 1 in which a plurality of electrical insulating blocks, for a plurality of connectors, are provided.

10. A combination of a circuit assembly as claimed in claim 9 in which the plurality of insulating blocks are so shaped as to be interchangeable with each other.

11. A combination of a circuit assembly as claimed in claim 9 in which a common bridging member is provided, the common bridging means having a plurality of constituent parts, each such part individually spanning an insulating block, and the provided plurality of insulating blocks are so shaped as to co-operate with each other.

12. A combination of a circuit assembly as claimed in claim 1 in which the at least substantially planar substrate comprises a heat sink.

13. A combination of at least one first circuit assembly, each first circuit assembly comprising an at least substantially planar substrate, on at least one major surface of which substrate is supported at least one component with leads extending therefrom, and there is also suported on said one major surface of the substrate at least one connector connected to said at least one component, the connector having a plurality of electrically conducting connector pieces, each connector piece both co-operating with a lead of the component, and providing a terminal of the circuit assembly, the leads extend at least substantially in at least one plane parallel to said one major surface of the substrate, and the connector pieces extend parallel to each other, and parallel to said one major surface of the substrate, the connector pieces are secured to a block of electrical insulating material of the connector, and extend at right angles to at least one surface of the insulating block, and the block of electrical insulating material is retained by at least one bridging member of the connector, and the arrangement is such that, with the bridging member secured to the substrate, the block co-operates with the bridging member and is loosely retained between the bridging member and the substrate whereby movement of the block is provided relative to the substrate and relative to the bridging member, in a plane normal to said one major surface of the substrate, and the combination also including at least one second circuit assembly, each second circuit assembly having at least one other connector cooperating and mating with said at least one connector of the first circuit assembly and abutting against said one surface of the insulating block.

* * * * *